(12) United States Patent
Eno et al.

(10) Patent No.: US 9,379,519 B2
(45) Date of Patent: Jun. 28, 2016

(54) LASER OSCILLATION DEVICE

(71) Applicant: Kabushiki Kaisha TOPCON, Tokyo-to (JP)

(72) Inventors: Taizo Eno, Tokyo-to (JP); Noriyasu Kiryuu, Tokyo-to (JP); Yuuichi Yoshimura, Tokyo-to (JP)

(73) Assignee: Kabushiki Kaisha TOPCON, Tokyo-to (JP)

( * ) Notice: Subject to any disclaimer, the term of this patent is extended or adjusted under 35 U.S.C. 154(b) by 0 days.

(21) Appl. No.: 14/830,781

(22) Filed: Aug. 20, 2015

(65) Prior Publication Data

US 2016/0087403 A1    Mar. 24, 2016

(30) Foreign Application Priority Data

Sep. 18, 2014 (JP) ................. 2014-189674

(51) Int. Cl.
*H01S 3/11* (2006.01)
*H01S 5/068* (2006.01)
*H01S 5/024* (2006.01)
*H01S 5/04* (2006.01)
*H01S 5/06* (2006.01)
(Continued)

(52) U.S. Cl.
CPC ............. *H01S 5/06821* (2013.01); *H01S 3/025* (2013.01); *H01S 3/042* (2013.01); *H01S 3/0405* (2013.01); *H01S 3/08072* (2013.01); *H01S 3/09415* (2013.01); *H01S 3/094038* (2013.01); *H01S 3/1022* (2013.01); *H01S 3/10061* (2013.01); *H01S 3/113* (2013.01); *H01S 3/1308* (2013.01); *H01S 5/024* (2013.01); *H01S 5/041* (2013.01); *H01S 5/0601* (2013.01); *H01S 5/06236* (2013.01); *H01S 3/0627* (2013.01); *H01S 3/1611* (2013.01); *H01S 3/1643* (2013.01)

(58) Field of Classification Search
CPC .......... H01S 3/08072; H01S 3/094038; H01S 3/09415; H01S 3/10061; H01S 3/1022; H01S 3/113; H01S 3/025; H01S 3/0405; H01S 3/042; H01S 3/1308; H01S 3/06236; H01S 5/06821; H01S 5/041; H01S 5/0601; H01S 5/024
USPC ...................................................... 372/10, 14
See application file for complete search history.

(56) References Cited

U.S. PATENT DOCUMENTS 7,664,148 B2 * 2/2010 Sakai ................. H01S 3/08036
  372/10
2005/0117085 A1 * 6/2005 Taira ..................... H01S 3/0602
  349/56

(Continued)

FOREIGN PATENT DOCUMENTS

JP    3585891 B2    11/2004
JP    2006-286735 A    10/2006
(Continued)

*Primary Examiner* — Kinam Park
(74) *Attorney, Agent, or Firm* — Nields, Lemack & Frame, LLC

(57) ABSTRACT

A laser oscillation device comprises a light emitting unit for projecting a pump laser beam, a laser medium for absorbing the pump laser beam and for emitting a spontaneous emission light, a saturable absorber for absorbing the spontaneous emission light and for emitting a pulsed light, and a holder for holding the laser medium in a close contact state, wherein a portion of the holder as appressed against at least one surface of the laser medium is made of a metal and the pump laser beam is projected to an edge portion of the laser medium as appressed against the holder.

4 Claims, 6 Drawing Sheets

(51) Int. Cl.
*H01S 3/13* (2006.01)
*H01S 5/062* (2006.01)
*H01S 3/08* (2006.01)
*H01S 3/094* (2006.01)
*H01S 3/0941* (2006.01)
*H01S 3/10* (2006.01)
*H01S 3/102* (2006.01)
*H01S 3/113* (2006.01)
*H01S 3/02* (2006.01)
*H01S 3/04* (2006.01)
*H01S 3/042* (2006.01)
*H01S 3/06* (2006.01)
*H01S 3/16* (2006.01)

(56) References Cited

U.S. PATENT DOCUMENTS

2006/0221434 A1* 10/2006 Eno .......................... H01S 3/109
 359/328
2009/0016385 A1* 1/2009 Sakai ....................... H01S 3/113
 372/11

FOREIGN PATENT DOCUMENTS

JP 2006-310743 A 11/2006
JP 4530348 B2 8/2010

* cited by examiner

LASER OSCILLATION DEVICE

BACKGROUND OF THE INVENTION

The present invention relates to a laser oscillation device using a semiconductor laser as a pump source.

As a laser oscillation device which is used for a spectroscopic measurement, a shape gauging IJ, a nonlinear crystal pump, and others, there is, for instance, a Q switch laser device using an isotropic laser medium such as Nd:YAG. The Q switch laser device comprises a light emitting unit for emitting a laser light with a predetermined wavelength and an optical resonator. The optical resonator comprises a first dielectric reflector, a second dielectric reflector, a laser crystal and a saturable absorber arranged between the first dielectric reflector and the second dielectric reflector.

In the Q switch laser device, a laser crystal is pumped by a pumped laser beam emitted from the light emitting unit, and a spontaneous emission light emitted from the laser crystal is absorbed by the saturable absorber. With the absorption of the spontaneous emission light, an electron density on a pump level of the saturable absorber gradually increases, and the saturable absorber becomes transparent when the electron density is saturated. When the saturable absorber becomes transparent, a laser oscillation occurs, and a pulsed light is emitted.

In case of performing a wavelength conversion of the pulsed light or a shape measurement by the pulsed light, it is desirable for a polarizing direction of the emitted pulsed lights to coincide with each other. However, the Q switch laser device has a polarization characteristic which the pulsed lights are alternately polarized in directions orthogonal to each other and emitted, and hence by providing with a polarization element in the optical resonator and the like, the polarizing direction of the pulsed light is controlled in the prior art.

SUMMARY OF THE INVENTION

It is an object of the present invention to provide a laser oscillation device which can easily uniform a polarizing direction of a laser light emitted in pulse manner.

To attain the above object, a laser oscillation device according to the present invention comprises light emitting unit for projecting a pump laser beam, a laser medium for absorbing the pump laser beam and for emitting a spontaneous emission light, a saturable absorber for absorbing the spontaneous emission light and for emitting a pulsed light, and a holder for holding the laser medium in a close contact state, wherein a portion of the holder as appressed against at least one surface of the laser medium is made of a metal and the pump laser beam is projected to an edge portion of the laser medium as appressed against the holder.

Further, in a laser oscillation device according to the present invention, a cooling unit is provided to the holder.

Further, in a laser oscillation device according to the present invention, a projecting position changing means is provided to the light emitting unit so that a projecting position of the pump laser beam with respect to the laser medium is capable of being changed by the projecting position changing means.

According to the present invention, a light emitting unit for projecting a pump laser beam, a laser medium for absorbing the pump laser beam and for emitting a spontaneous emission light, a saturable absorber for absorbing the spontaneous emission light, and for emitting a pulsed light, and a holder for holding the laser medium in a close contact state, wherein a portion of the holder as appressed against at least one surface of the laser medium is made of a metal and the pump laser beam is projected to an edge portion of the laser medium as appressed against the holder. As a result, a considerable thermal birefringence can occur in the laser medium, the polarizing directions of the pulsed light can be easily uniformed, an optical member does not need to be additionally provided in order to uniform the polarizing directions of the pulsed light, and a reduction in size and cost of the device can be achieved.

Further, according to the present invention, a cooling unit is provided to the holder. As a result, the thermal birefringence formed in the laser medium can be further increased and an output of the pump laser beam projected from the light emitting unit, can be reduced.

Further, according to the present invention, a projecting position changing means is provided to the light emitting unit so that a projecting position of the pump laser beam with respect to the laser medium is capable of being changed by the projecting position changing means. As a result, the projecting position of the pump laser beam is capable of being easily changed and the pulsed light with a desired polarizing direction can be obtained.

DETAILED DESCRIPTION OF THE PREFERRED EMBODIMENTS

Figure 1A:
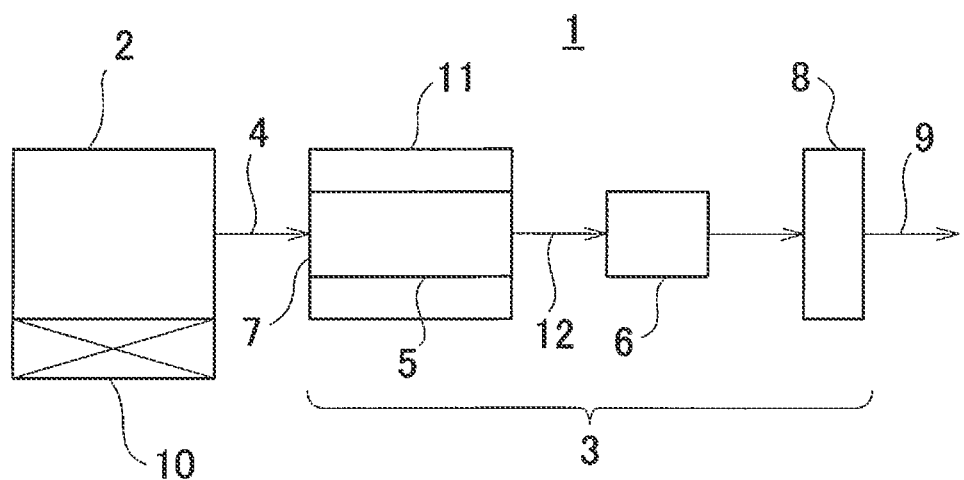
FIG. 1A shows a laser oscillation device in a case where a laser medium and a saturable absorber are separately provided.

Description will be given below on embodiments of the present invention by referring to the drawings.

First, in FIG. 1A and FIG. 1B, a laser oscillation device according to an embodiment of the present invention will be described. It is to be note that, as the laser oscillation device in the present embodiment, a Q switch laser device is used.

In FIG. 1A, reference numeral 1 denotes a laser oscillation device 1, and the laser oscillation device 1 comprises a light emitting unit 2 and an optical cavity 3. A projecting position changing means 10 is provided with the light emitting unit 2. Further, the light emitting unit. 2 comprises a light emitter (not shown) which emits a laser light, for instance, a semiconductor laser and a condenser lens (not shown) or the like, and is designed so as to emit a pump laser beam 4 with a predetermined wavelength.

Further, the optical cavity 3 comprises a laser medium 5 as a first optical crystal, a saturable absorber 6 as a second optical crystal, a first cavity mirror 7 formed on one end face of the laser medium 5 facing the light emitting unit 2 and a second cavity mirror 8 provided on an exit side of the saturable absorber 6.

Figure 2:
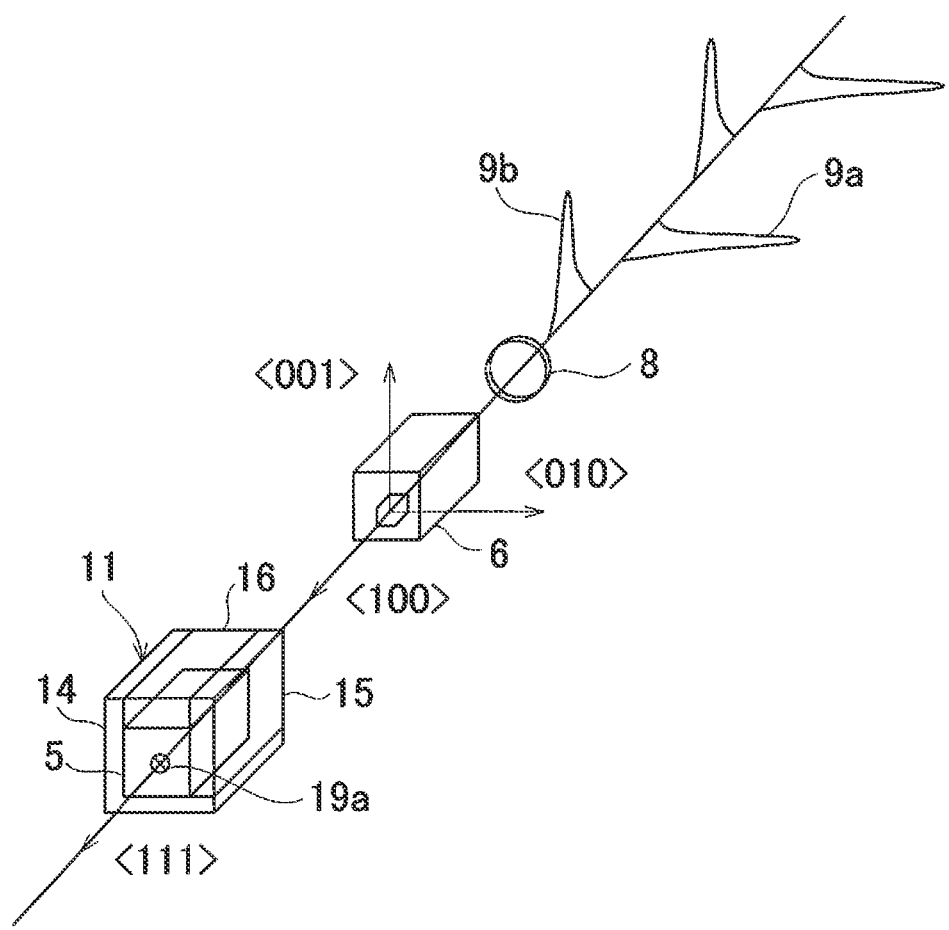
FIG. 2 is an explanatory drawing to explain a polarizing direction of a pulsed light in a case where a pump laser beam is projected to a central portion of the laser medium.

The optical cavity 3 is arranged in such a manner that a <111> (see FIG. 2) axis of the laser medium 5, a <100> (see. FIG. 2) axis of the saturable absorber 6, and an optical axis of the pump laser beam 4 become parallel to each other, and is designed so as to emit a pulsed light 9. In FIG. 1A, the laser medium 5 and the saturable absorber 6 are separately provided. The laser medium 5 is held by a metallic holder 11 which is a cooling means for instance, and adhered to the holder 11 by a thermally conductive adhesive or the like.

As the laser medium 5, for instance, an Nd3+:YAG crystal is used. The laser medium 5 is pumped by the pump laser beam 4 with a wavelength of 808 nm, amplifies the pump laser beam 4 as entered, and emits a spontaneous emission light (a photon) 12 with a wavelength of 1064 nm.

Further, as the saturable absorber 6, a Cr4+YAG crystal is used for instance. The saturable absorber 6 has the properties of absorbing the spontaneous emission light 12 emitted from the laser medium 5. Further, the saturable absorber 6 has properties of becoming transparent when a transmittance increases due to absorbing the spontaneous emission light 12 and an electron density increases and reaches saturation. By the fact that the saturable absorber 6 becomes transparent, the pulsed light 9 with the wavelength of 1061 nm is emitted from the saturable absorber.

The first cavity mirror 7 highly transmits the pump laser beam 4 from the light emitting unit 2 and highly reflects the spontaneous emission light 12 emitted from the laser medium 5. Further, the pulsed light 9 is emitted through the second cavity mirror 8.

Further, as the projecting position changing means 10, there are a method for adjusting a height of the light emitting unit 2 or adjusting an inclination of the light emitting unit 2 by a bolt for instance or a method for adjusting an inclination of the light emitting unit. 2 by providing an elastic member and elastically deforming the elastic member or the like. When the height or the inclination of the light emitting unit 2 is changed by the projecting position changing means 10, a projecting position of the pump laser beam. 4 which enters the laser medium 5 can be changed.

When the pump laser beam 4 is projected from the light emitting unit 2, the pump laser beam 4 passes through the first cavity mirror 7 and enters the laser medium 5. The laser medium 5 is pumped by the pump laser beam 4, the pump laser beam 4 is absorbed and amplified, and enters the saturable absorber 6 as the spontaneous emission light 12. Due to the absorption of the spontaneous emission light 12, when the electron density of the saturable absorber 6 is increased and becomes saturated, the saturable absorber 6 becomes transparent, and the pulsed light 9 emits through the second cavity mirror 8.

Figure 1B:
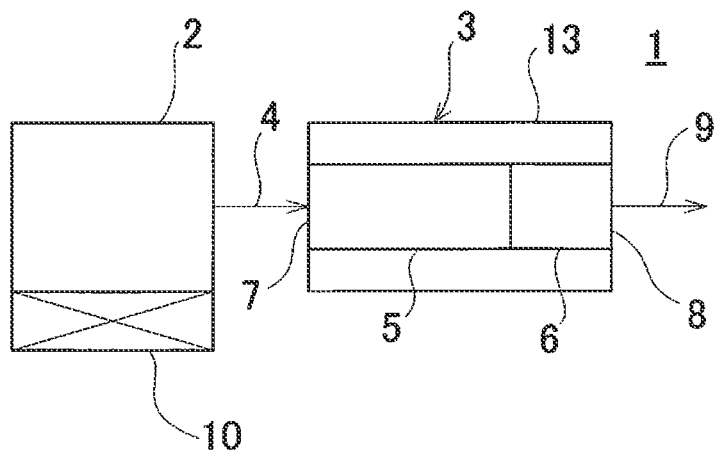
FIG. 1B shows the laser oscillation device in a case where the laser medium and the saturable absorber are integrated.

Further, in FIG. 1B, the optical cavity 3 has configuration that the laser medium 5 and the saturable absorber 6 are integrated by an optical contact or a thermal diffusion bonding, or the like. The laser medium 5 and the saturable absorber 6 are held in a metallic holder 13 which has a function as a cooling means. The first cavity mirror 7 is provided on an incidence surface of the laser medium 5 and the second cavity mirror 8 is provided on an exit surface of the saturable absorber 6.

In case of FIG. 1B, similarly in case of FIG. 1A, when the pump laser beam. 4 is projected from the light emitting unit 2, the pump laser beam 4 passes through the first cavity mirror 7 and enters the laser medium 5. The laser medium 5 is pumped by the pump laser beam 4, and a part of the spontaneous emission light (a photon) 12, as generated at this moment, enters the saturable absorber 6. Further, due to the absorption of the spontaneous emission light 12 by the saturable absorber 6, when the electron density of the saturable absorber 6 is increased and becomes saturated, the saturable absorber 6 becomes transparent, and the pulsed light 9 emits through the second cavity mirror 8.

Next, in FIG. 2, a polarizing direction of the pulsed light 9 will now be described. It is to be rioted that FIG. 2 shows a case where the laser medium 5 and the saturable absorber 6 are separately provided.

In FIG. 2, the holder 11 comprises a metallic lower holder part 14 with an L-shaped cross section, a metallic lateral holder part 15 with a rectangular cross section and a resin upper holder part 16 with a rectangular cross section. The laser medium 5 is arranged at a corner portion of the lower holder part 14 and pressed from a lateral direction by the lateral holder part 15, and an upper portion of the laser medium 5 is closed by the upper holder part 16. As a result, the laser medium 5 is held by the holder 11. Further, the laser medium 5 and the lower holder part 14 are bonded to each other, the laser medium 5 and the lateral holder part 15 are bonded to each other, and the laser medium 5 and the upper holder part 16 are bonded to each other by the thermally conductive adhesive, respectively.

Figure 3:
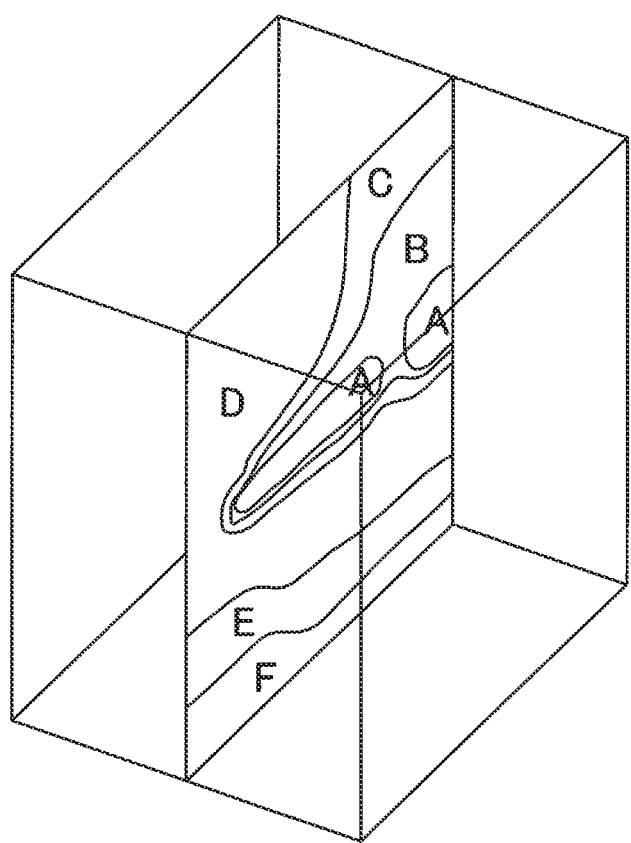
FIG. 3 is an explanatory drawing to show a temperature distribution of the laser medium in a case where the pump laser beam is projected to the laser medium.

Further, FIG. 3 is a longitudinal sectional view which shows a temperature distribution of inside of the laser medium 5 in a case where the pump laser beam 4 is projected to a projecting position 19a at a central portion of the laser medium 5 (see FIG. 2).

In FIG. 3, A represents a region with the highest temperature, F represents a region with the lowest temperature, and the temperature is gradually lowered from A to F. As shown in FIG. 3, a lower portion, which is in contact with the metallic lower holder part 14, is intensively cooled as compared with an upper portion, which is in contact with the resin upper holder part 16, a temperature of the lower portion is precipitously lowered, and a temperature gradient is increased. Therefore, a thermal stress is produced in the laser medium 5 due to a difference of thermal expansion between the central portion and the lower portion, and a thermal birefringence occurs.

In this state, in a case where the spontaneous emission light 12 projected from the laser medium 5 enters the saturable absorber 6, as shown in FIG. 2, a P-polarized pulse 9a and an S-polarized pulse 9b are alternately emitted from the saturable absorber 6, and a polarizing direction of the pulsed light 9 is not stabilized.

In the present invention, the inventors have discovered that by changing a projecting position of the pump laser beam 4 as projected to the laser medium 5, it is possible to uniform the polarizing directions of the pulsed light 9. With reference to FIG. 4, FIG. 5A, FIG. 5B, and FIG. 6A to FIG. 6L, the uniformization of the polarizing directions of the pulsed light 9 will now be described hereinafter.

Figure 4:
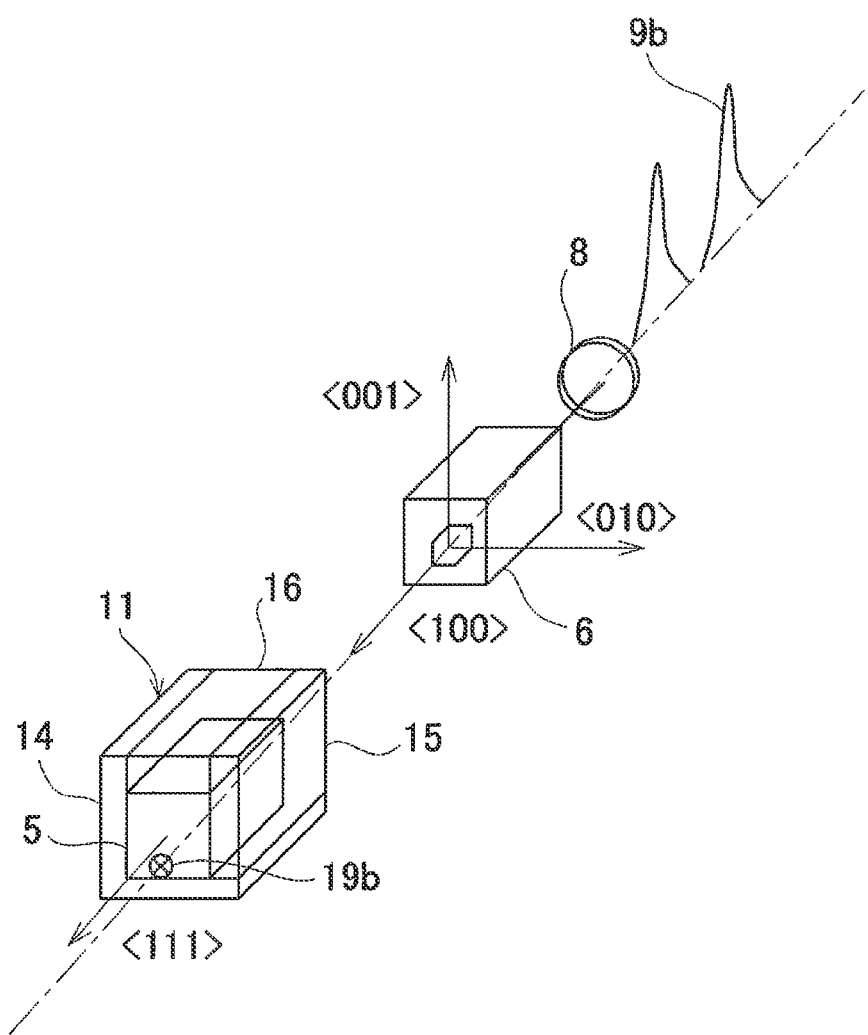
FIG. 4 is an explanatory drawing to explain a polarizing direction of the pulsed light in a case where the pump laser beam is projected to a lower end portion of the laser medium.

FIG. 4 shows a case where the pump laser beam 4 is projected to a projecting position 19b of a lower end portion of an incidence surface of the laser medium 5. By projecting the pump laser beam 4 to the projecting position 19b, the pulsed light 9 as emitted from the saturable absorber 6 wholly turns to the S-polarized pulse 9b, and the polarizing directions of the pulsed light 9 are uniformed.

As a reason that the polarizing directions are uniformed, the lower surface of the laser medium 5 is in contact with the metallic lower holder part 14 which is the cooling means, and since the projecting position 19 is close to the cooling means, a more precipitous temperature gradient than that shown in FIG. 3 is produced in the lower end portion of the laser medium 5. Therefore, it can be considered that the greater thermal birefringence occurs in the laser medium 5 and the polarizing directions of the pulsed light 9 are uniformed by the greater thermal birefringence.

Figure 5A:
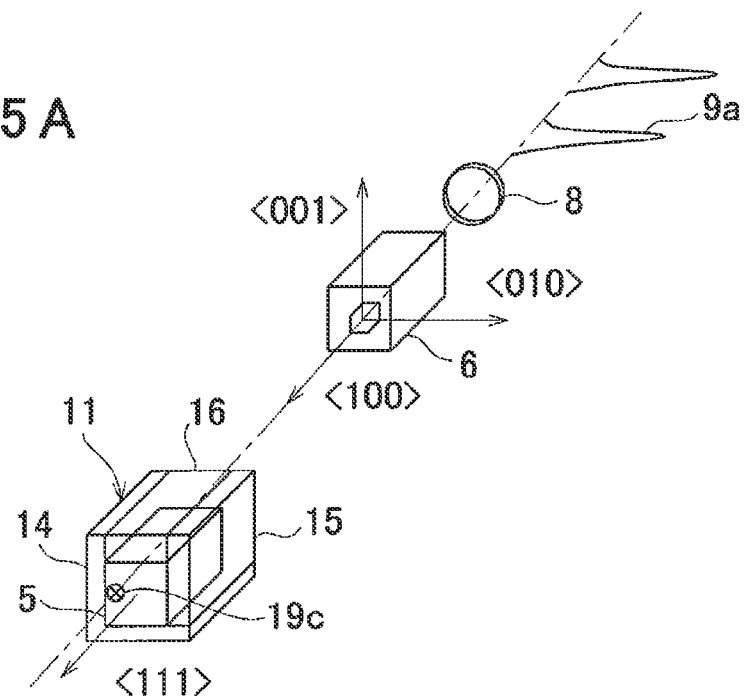
FIG. 5A is an explanatory drawing to explain a Polarizing direction of the pulsed light in a case where the pump laser beam is projected to a left side end portion of the laser medium.
Figure 5B:
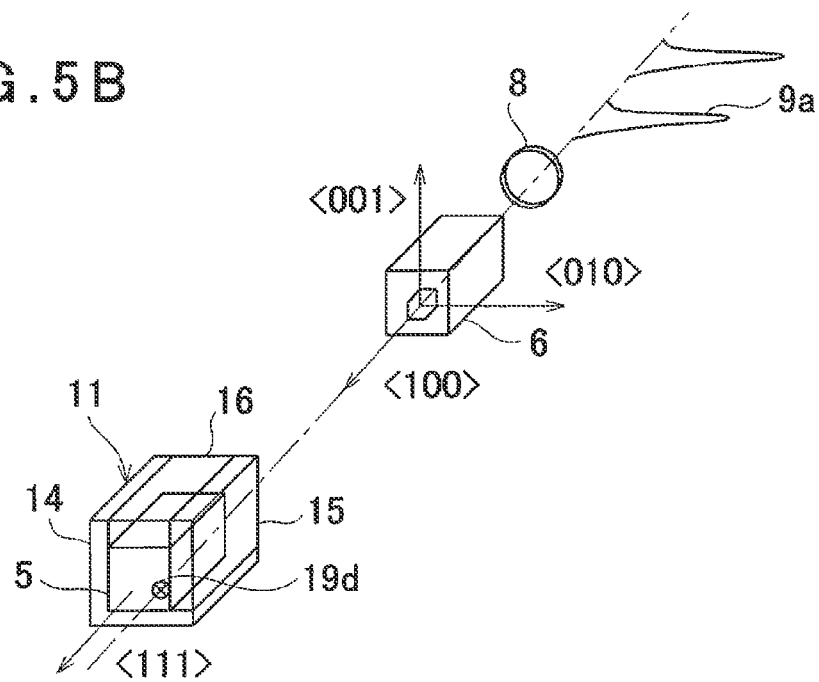
FIG. 5B is an explanatory drawing for explaining a polarizing direction of the pulsed light in a case where the pump laser beam is projected to a right side end portion of the laser medium.

Further, FIG. 5A and FIG. 5B show respectively cases where the pump laser beam 4 are projected to projecting positions 19c and 19d on both the side end portions of the incidence surface of the laser medium 5. In a case where the pump laser beam 4 is projected to the projecting positions 19c and 19d, the pulsed light 9 emitting from the saturable absorber 6 wholly turns to a P-polarized pulse 9a, and all the polarizing directions of the pulsed light 9 are uniformed.

In FIG. 5A, a side surface of the laser medium 5 which is the left side with respect to a paper plane is in contact with the metallic lower holder part 14 which is the cooling means, the laser medium 5 is cooled by the lower holder part 14, and a precipitous thermal gradient is produced similar to case shown in FIG. 4. Further, in FIG. 5B, a side surface of the laser medium 5 which is the right side with respect to the paper plane is in contact with the metallic lateral holder part 15 which is the cooling means, the laser medium 5 is cooled by the lateral holder part 15, and a precipitous thermal gradient is produced similar to case shown in FIG. 4.

Therefore, as shown in FIG. 5A and FIG. 5B, even in a case where the pump laser beam 4 is projected to the projecting positions 19c and 19d, it can be considered that the significant thermal birefringence occurs in the laser medium 5 and the polarizing directions of the pulsed light 9 are uniformed by the significant thermal birefringence.

It is to be noted that, in a case where the pump laser beam 4 is projected to an upper end portion of the incidence surface of the laser medium 5, the polarizing directions of the pulsed light 9 as emitted from the saturable absorber 6 are not uniformed. As a reason for that, it can be considered that the upper holder part 16 which is in contact with the upper surface of the laser medium 5 is made of a resin, a precipitous temperature gradient is not produced in the laser medium 5 because a cooling effect of the laser medium 5 is low, and the considerable thermal birefringence does not occur in the laser medium 5.

FIG. 6A to FIG. 6L show cases where the pump laser beam 4 is projected to the laser medium 5 under the various condition.

It is to be noted that, in FIG. 6A to FIG. 6L, reference numeral 17 denotes a clearance groove formed at a corner portion of the lower holder part 14, and reference numeral 18 denotes a clearance groove formed at a lower end portion of the lateral holder part 15. Forming the clearance grooves 17 and 18 can prevent R from remaining when the lower holder part 14 and the lateral holder part 15 are machined. Therefore, at the time of disposing the laser medium 5 to the holder 11, the lower surface of the laser medium 5 and the lower holder part 14 can be assuredly appressed against each other, she left side surface of the laser medium 5 and the lower holder part 14 can be assuredly appressed against, each other, and the right side surface of the laser medium 5 and the lateral holder part 15 can be assuredly appressed against each other, respectively.

Figure 6A:
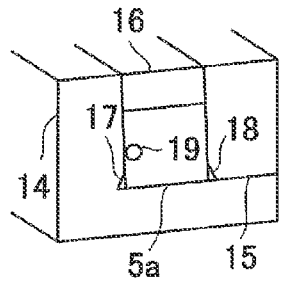
FIG. 6A to FIG. 6L are explanatory drawings to explain various conditions in case of projecting the pump laser beam to the laser medium.
Figure 6B:
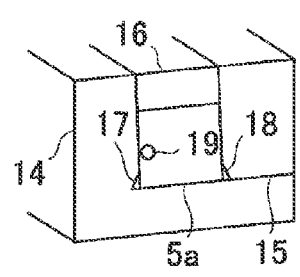
Figure 6C:
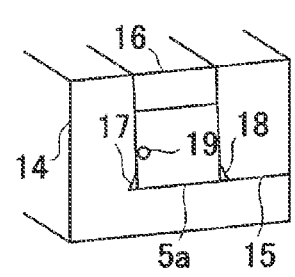
Figure 6D:
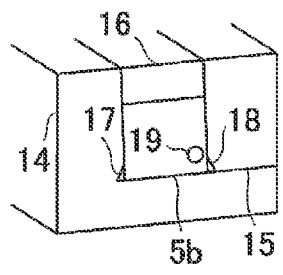
Figure 6E:
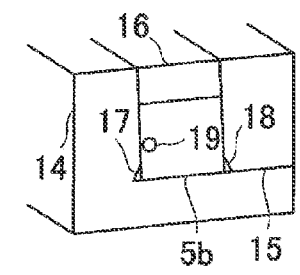
Figure 6F:
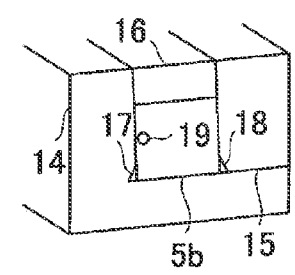
Figure 6G:
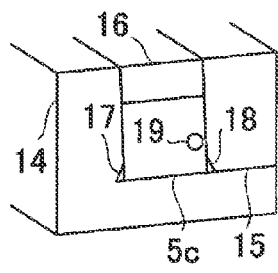
Figure 6H:
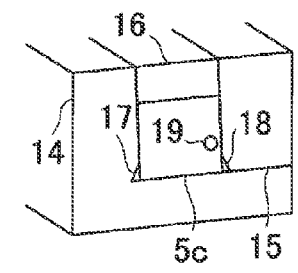
Figure 6I:
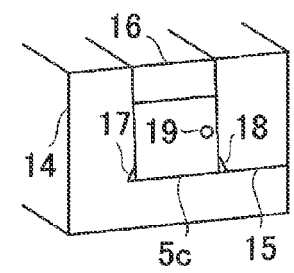
Figure 6J:
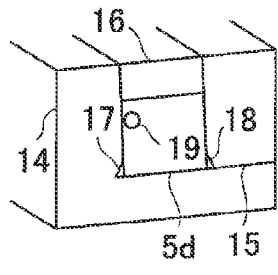
Figure 6K:
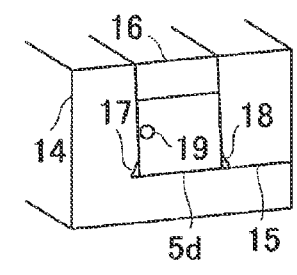
Figure 6L:
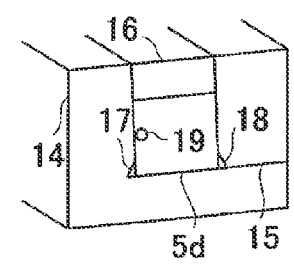

In FIG. 6A to FIG. 6C, a sample 5a of the laser medium 5 is used, in FIG. 6D to FIG. 6F, a sample 5h of the laser medium 5 is used, in FIG. 6G to FIG. 6I, a sample 5c of the laser medium 5 is used, and in FIG. 6J to FIG. 6L, a sample 5d of the laser medium 5 is used.

Further, in FIG. 6A, FIG. 6D, FIG. 6G, and FIG. 6J, a spot diameter of the pump laser beam 4 projected to the samples 5a to 5d is 70 µm, in FIG. 6B, FIG. 6E, FIG. 6H, and FIG. 6K, a spot diameter of the pump laser beam 4 projected to the samples 5a to 5d is 60 µm, and in FIG. 6C, FIG. 6F, FIG. 6I, and FIG. 6L, a spot diameter of the pump laser beam 4 projected to the samples 5a, to 5d is 50 µm.

Further, all of FIG. 6A to FIG. 6L show cases where the projecting position 19 of the pump laser beam 4 is located at the side end portion or the lower end portion of the laser medium 5, i.e., a portion close to the lower holder part 14 or the lateral holder part 15 as the cooling means so that the considerable thermal birefringence can occur in the laser medium 5.

Under respective conditions shown in FIG. 6A to FIG. 6L, in a case where the pump laser beam 4 is projected from the light emitting unit 2 (see FIG. 1), the pulsed light 9 emitted from the saturable absorber 6 wholly turns to the P-polarized pulse 9a or wholly turns to the S-polarized pulse 9b, and the polarizing directions of the pulsed light 9 are all uniformed.

Therefore, it is understood that, in a case where an Nd3+: YAG crystal is used as the laser medium 5, the polarizing directions of the pulsed light 9 are uniformed irrespective of the individual differences between the respective samples 5a to 5d and irrespective of the spot diameter of the pump laser beam 4 to be projected.

As described above, in the present embodiment, by the fact that the pump laser beam 4 is projected to the end portion of the incidence surface of the laser medium 5, i.e., the position near the surfaces adhering to the lower holder part 14 or the lateral holder part 15 as the cooling means which are made of a metal and the precipitous thermal gradient is produced in the laser medium 5 so that the considerable thermal birefringence occurs, the polarizing directions of the pulsed light 9 emitted from the saturable absorber 6 can be uniformed.

Therefore, by inclining the light emitting unit 2 by the projecting position changing means 10 and by selecting the projecting position 19 of the pump laser beam 4 with respect to the laser medium 5, it is possible to easily uniform the polarizing directions of die pulsed light 9 and to easily switch the polarizing directions and to obtain the pulsed light 9 with a desired polarizing direction.

Further, in order to uniform the polarizing directions of the pulsed light 9, since there is no need to additionally provide an optical member with the optical cavity 3, the laser oscillation device 1 can be miniaturized and a cost can be reduced.

Further, the more the laser medium 5 is cooled, the more the thermal gradient formed in the laser medium 5 is increased, and the thermal birefringence becomes bigger. When a cooling unit such as a Peltier device is additionally provided to the holder 11 and the holder 11 is further cooled by the cooling unit, the thermal gradient and the thermal birefringence formed in the laser medium 5 can be further increased.

In the present embodiment, the pump laser beam 4 is projected to the lower portion or one of both the side portions of the laser medium 5, but the pump laser beam 4 may be projected to the upper portion of the laser medium 5 in a case where the upper holder part 16 is made of a metal. Further, to produce the thermal birefringence in the laser medium 5, since the pump laser beam 4 could be projected to a position near a surface of the laser medium 5 which is in contact with the metal, only a portion of the holder 11 which is appressed against any one surface of the laser medium 5 may be made of a metal. That is to say, it is essential only that a portion of the holder 11 appressed against at least one surface of the laser medium 5 is made of a metal.

Further, in the present embodiment, as the saturable absorber 6, the Cr4+YAG crystal is used, but a V3+:YAG crystal or GaAs (gallium arsenide) may be used as the saturable absorber.

The invention claimed is:

1. A laser oscillation device, comprising a light emitting unit for projecting a pump laser beam, a laser medium for absorbing said pump laser beam and for emitting a spontaneous emission light, a saturable absorber for absorbing said spontaneous emission light and for emitting a pulsed light, and a holder for holding said laser medium in a close contact state, wherein a portion of said holder as appressed against at least one surface of said laser medium is made of a metal and said pump laser beam is projected to an edge portion of said laser medium as appressed against said holder.

2. A laser oscillation device according to claim 1, wherein a cooling unit is provided to said holder.

3. A laser oscillation device according to claim 1, wherein a projecting position changing means is provided to said light emitting unit so that a projecting position of said pump laser beam with respect to said laser medium is capable of being changed by said projecting position changing means.

4. A laser oscillation device according to claim 2, wherein a projecting position changing means is provided to said light emitting unit so that a projecting position of said pump laser beam with respect to said laser medium is capable of being changed by said projecting position changing means.

* * * * *